United States Patent [19]

Tailliet

[11] Patent Number: 5,347,185
[45] Date of Patent: Sep. 13, 1994

[54] PROTECTION STRUCTURE AGAINST LATCH-UP IN A CMOS CIRCUIT

[75] Inventor: Francois Tailliet, Epinay sur Seine, France

[73] Assignee: SGS-Thomson Microelectronics, S.A., Gentilly Cedex, France

[21] Appl. No.: 892,941

[22] Filed: Jun. 3, 1992

[51] Int. Cl.$^5$ .......................... H01P 1/22; H03K 3/26
[52] U.S. Cl. .................... 307/540; 307/566; 307/567; 307/318; 361/91; 361/111
[58] Field of Search ...................... 307/566.7, 540, 318; 361/91, 111

[56] References Cited

U.S. PATENT DOCUMENTS

| | | | |
|---|---|---|---|
| 4,032,800 | 6/1977 | Dröschen et al. | 307/318 |
| 4,922,367 | 5/1990 | Hidaka | 361/111 |
| 4,939,616 | 7/1990 | Roundtree | 361/56 |
| 4,948,989 | 8/1990 | Spratt | 307/318 |
| 5,006,736 | 4/1991 | Davies | 307/318 |
| 5,196,981 | 3/1993 | Kuo | 361/111 |
| 5,198,957 | 3/1993 | Welty et al. | 361/111 |

FOREIGN PATENT DOCUMENTS 0324185 7/1989 European Pat. Off. .
9106285 5/1991 France .
2227898 8/1990 United Kingdom .

OTHER PUBLICATIONS

Patent Abtracts of Japan, vol. 11, No. 165 (E-510)(2612) May 27, 1987 (summarizing Japanese app'n JP-A-61,296,770).
Patent Abstracts of Japan, vol. 11, No. 265 (E-535)(2712) Aug. 27, 1987 (summarizing Japanese app'n JP-A-62,069,661).

*Primary Examiner*—Margaret Rose Wambach
*Attorney, Agent, or Firm*—Robert Groover

[57] ABSTRACT

A CMOS circuit protected against latch-up. A limiter parallel to the internal circuitry of the CMOS circuit increases the external current for the triggering of the latch-up in the event of overvoltage on the supply. In one embodiment, the parallel limiter is intrinsically protected against electrostatic discharges. In another embodiment, the limiter is protected by a series connected resistor and a separate shunt-connected ESD protection structure.

24 Claims, 2 Drawing Sheets

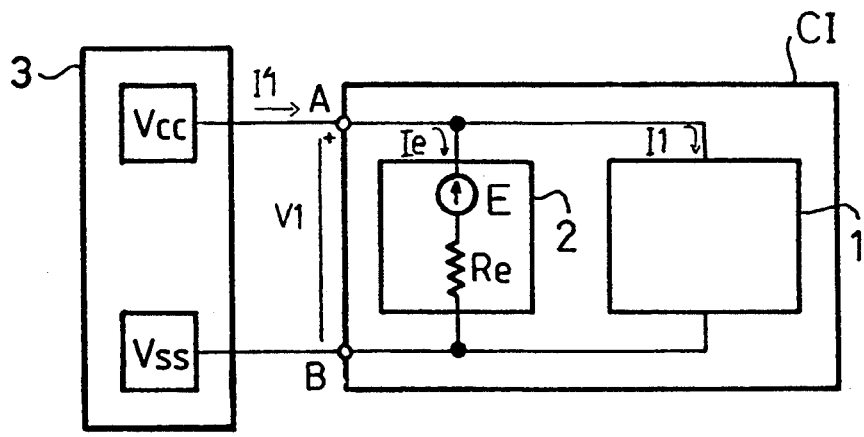
FIG_1
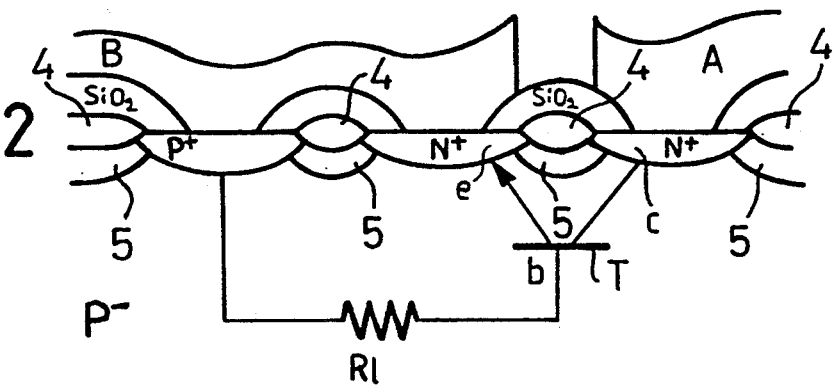
FIG_2
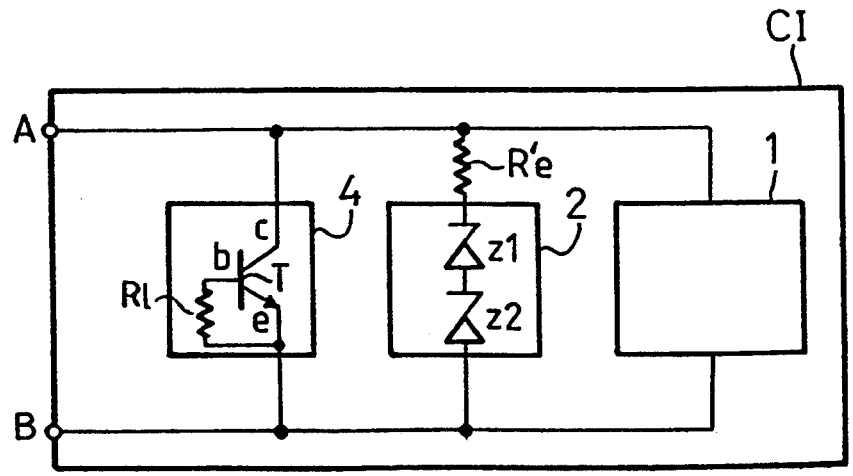
FIG_3

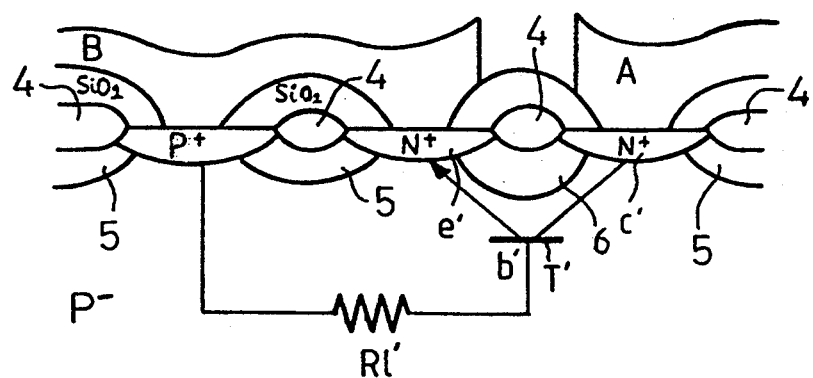
FIG_4
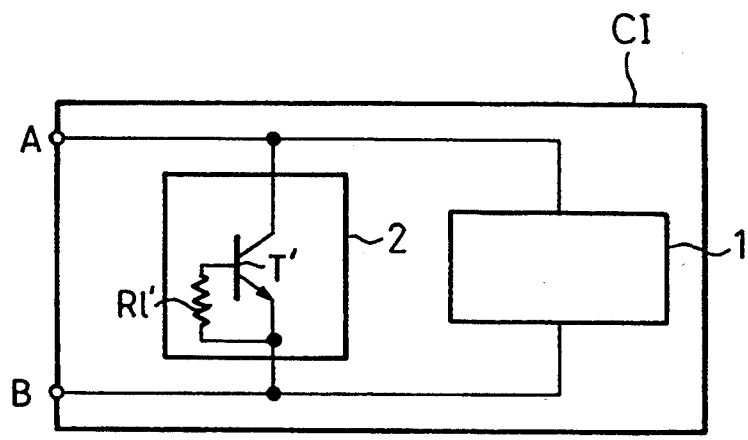
FIG_5

PROTECTION STRUCTURE AGAINST LATCH-UP IN A CMOS CIRCUIT

BACKGROUND OF THE INVENTION

1. Field of the Invention

The invention relates to CMOS integrated circuits and, more specifically, to the protection of these circuits against the phenomenon of latch-up which may destroy certain parts of the CMOS integrated circuit.

CMOS technology gives rise to numerous parasitic structures with four layers PNPN. Although these P nor N regions are needed for the desired transistors, the combination of four successive P,N,P, and N layers produces a (undesired but operable) thyristor. As extensively discussed in the device literature, such a thyristor can be analyzed in terms of two parasitic bipolar transistors and associated series resistors.

A single unwanted pulse or an overvoltage on the supply may prompt the triggering of some of these thyristors: this is the phomomenon of latch-up of CMOS circuits.

2. Description of the Prior Art

The triggering of these parasitic thyristor structures sets up a variably sharp short-circuit which is generally destructive through the over-heating of the circuit. The standard way of preventing latch-up is to use very strict rules for the designing of the CMOS circuits. In particular:

to reduce the gain of the bipolar transistors, the width of their base is increased by giving the wells a substantial depth and by making the diffusions in the substrate at a distance from the wells;

to reduce the lateral resistance values, the substrate and well connectors are greatly increased in number.

The reduction of the lateral resistance values also serves to reduce the gain of the bipolar transistors (by the short-circuit of the emitter-base junction).

These rules entail very severe constraints and are very costly in terms of space with uncertain results in practice: for one circuit, they will give very good results and for another circuit they will give poor results.

In certain cases, it is preferred to use an epitaxial substrate instead of one that is uniformly doped in the bulk (a bulk substrate). The epitaxial substrate is highly enriched, for example with N+ doping, surmounted by a very fine epitaxial layer with low level N− doping. It can be used chiefly to reduce the lateral resistance values but this is a very costly technology for a result that is still not sure (because of the problem of the reproducibility of the result from one circuit to another).

Take a CMOS circuit. At two supply terminals, it receives a positive voltage Vcc, generally five volts in terms of nominal value, and a more negative (ground) voltage Vss, generally equal to zero volts. The CMOS circuit accepts a maximum voltage Vmax=Vcc−Vss, at its terminals, of the order of 7 volts. The immunity of the CMOS circuit to the latch-up phenomenon is defined by the over-voltage V1 and the external current I1 for which the latch-up is triggered. Typically, it is sought to have V1 greater than 2Vmax and the current I1 as high as possible. The above-described approaches can be used to have I1 of the order of 20 milliamperes. By the present invention, it is sought to take I1 to one hundred milliamperes. Thus, CMOS products will be obtained that are truly well protected against the latch-up phenomenon. Furthermore, it is sought to reduce both the cost of the protection in terms of the place occupied by the circuit and its cost price.

The invention starts with a standard technology CMOS circuit with limit parameters of immunization to latch-up (V1, I1) proper to the internal circuitry.

In the invention, a limiter component is interposed between the supply terminals, in parallel with the internal CMOS circuitry. This limiter component gets triggered for a voltage E at its terminals of less than V1 and consumes high current $I_e$ far higher than the current I1 for a voltage V1 at its terminals, i.e. this is a component with low equivalent resistance when it is triggered.

In the invention, the limiter component is integrated into the CMOS circuit. Thus, while the intensity of the external current needed to prompt the latch-up phenomenon in the internal circuitry remains unchanged (I1), by contrast the total external current I'1 to be given to the CMOS circuit, equal to I1 without the limiter, is increased in the invention by the current (Ie) flowing through the limiter. Thus, the apparent value I'1 of the external current for triggering the latch-up has been increased. This apparent value then depends on the sizing of the limiter.

In one improvement, the limiter is protected against electrostatic discharges.

SUMMARY OF THE INVENTION

The invention therefore relates to a CMOS circuit protected against a latch-up phenomenon, comprising an internal circuitry powered between a first positive supply terminal and a second negative or zero supply terminal, the internal circuitry having, as known parameters, a current and a voltage for the triggering of the latch-up phenomenon, wherein a limiter is placed in parallel on the internal circuitry, between the first supply terminal and the second supply terminal, this limiter having a triggering threshold below the triggering voltage for the latch-up of the internal circuitry and consuming current of a value far higher than the current for triggering the latch-up of the internal circuitry when a voltage at least equal to the latch-up triggering voltage is applied between the first and second supply terminals.

BRIEF DESCRIPTION OF THE DRAWINGS

Other features and advantages of the invention are given in the following description, which is made by way of a non-restrictive indication of the invention and with reference to the appended drawings, of which:

FIG. 1 shows a block diagram of a CMOS circuit comprising a protection device against latch-up according to the invention;

FIG. 2 shows a structure of a known device for protection against electrostatic discharges;

FIG. 3 shows an electrical diagram of a CMOS circuit in a first exemplary embodiment of a limiter according to the invention, using the device shown in FIG. 2;

FIG. 4 shows a structure of a limiter in a second exemplary embodiment according to the invention;

FIG. 5 shows an electrical diagram of a CMOS circuit according to FIG. 4.

MORE DETAILED DESCRIPTION

FIG. 1 is a block diagram of a protection device according to the invention. A CMOS integrated circuit CI has an internal circuitry 1 to be shielded against latch-up and a limiter 2. Each element 1, 2 is parallel-connected to two supply terminals A and B. A supply 3 gives a positive voltage Vcc at the terminal A and a negative or zero voltage Vss at the terminal B.

The potential difference V between the two supply terminals of the CMOS circuit CI has, in a standard way, a typical value of 5 volts referenced Vdd and a maximum value of the order of 7 volts referenced Vmax. For a voltage threshold E at the terminals of the CMOS circuit, hence at the terminals of the limiter, the latter gets triggered. It then behaves like a Thévenin generation of voltage E in series with a low value resistor Re (FIG. 1).

Thus, if the internal circuitry 1 of the CMOS circuit is characterized by a latch-up triggering current/voltage pair referenced (I1, V1), if the voltage V at the terminals of the CMOS circuit becomes equal to V1 (overvoltage on the supply) and if the triggering threshold E of the limiter is lower than the voltage V1, then the intensity of the current $I_e$ that flows through the limiter is given by the following expression:

$$Ie = \frac{V1 - E}{Re}$$

Since the limiter 2 and the internal circuitry 1 are each parallel-connected to the supply terminals A and B of the CMOS circuit, in the event of supply overvoltage V1, the external supply should give a current I'1 equal to the sum of the currents of the two branches, i.e. I'1=Ie+I1 is now the amount required to trigger the latch-up.

The current for triggering the latch-up of the internal circuitry 1 is always I1, but the apparent current I'1 for triggering the latch-up of the CMOS circuit is itself increased by the current flowing through the limiter which has the voltage V1 at its terminals.

It is easy to obtain fairly substantial currents of the order of a hundred milliamperes with well known limiter structures, two examples of which are described below.

To prevent excessive power consumption by the CMOS circuit, preferably a limiter will be chosen with a threshold E greater than the maximum voltage Vmax allowable by the CMOS circuit. In one example Vmax is equal to 7 volts and E is equal to 12 volts.

Generally, the limiter according to the invention has a threshold E ranging from 10 to 15 volts (E>Vmax, E<V₁) and a low dynamic resistance Re (up to several tens of ohms) so as to let through a great deal of current: a high gain in latch-up current is sought.

Thus, in a standard example of a CMOS circuit with a latch-up triggering voltage V1 of the order of 18 volts and a latch-up triggering voltage I1 of the order of 20 milliamperes, it is easy to determine the necessary characteristics (E, Re) of the limiter to have an apparent triggering current I'1 of (for example) 320 milliamperes for an overvoltage V1. Indeed, we have the following relationships:

$$Vmax < E < V1$$

$$I'1 = I1 + Ie \text{ and } Ie = \frac{(V1 - E)}{Re}$$

E is chosen for example as being equal to 12 volts whence, in this numerical example:
Re=20 ohms.
The current Ie, for an overvoltage V1 of 18 volts, is equal in this example to 300 milliamperes.

Generally, the limiter has a threshold E ranging from 10 to 15 volts (E>Vmax, E<V1) and a low dynamic resistance Re (up to some tens of ohms) so as to let through a great deal of current: a high gain in latch-up current is sought.

In a first exemplary embodiment, illustrated in FIG. 3, a limiter is formed by zener diodes in series, such that the sum of the threshold voltages of the diodes is equal to the triggering voltage E of the limiter. Alternatively, it is possible to use a single diode with the desired threshold voltage or, more generally, a series association of components that can be likened, in operation, to diodes in reverse (diode-mounted transistor for example).

In a preferred example (FIG. 3), there will be two zener diodes in series, of the CMOS type, each formed by a P+/N+ junction (not shown) in a well, with a typical threshold voltage of the order of 6 volts. A practical exemplary embodiment of such diodes is described in the Italian patent No. 2 2228 A/89 filed on behalf of Sgs-Thomson Microelectronics s.r.l. on 31st October 1989, as well as corresponding U.S. application Ser. No. 07/604,895 and corresponding European application EP90/2,028,406, all of which are hereby incorporated by reference.

This diode device is equivalent to a single limiter likened to a Thevenin generator with E, Re characteristics of the order of 12 volts and 20 ohms. However, it does not intrinsically withstand electrostatic discharges, another phenomenon to which the CMOS circuits are highly sensitive. Indeed, the electrostatic discharges may induce currents of several amperes. A protection device against the electrostatic discharges therefore has to be added on to the limiter. The CMOS internal circuitry 1 is itself already protected in a standard way from electrostatic discharges.

In a known way (FIG. 2) the protection device against electrostatic discharges is a lateral bipolar transistor T, for example of the NPN type in a P⁻ substrate. It is also possible to use a PNP type lateral transistor made in an N type well. In the example, the NPN type lateral bipolar transistor is obtained in a P⁻ type substrate with the following from left to right: a first N+ type diffusion c connected to Vcc, a second N+ type diffusion e connected to Vss and a third P+ type substrate contact diffusion connected to Vss. The diffusion c is the collector and the diffusion e is the emitter of the NPN type protection bipolar transistor T in this example. Its base b is constituted by the substrate zone between the emitter and the collector, and biased through a lateral resistor R1 between the P⁻ substrate and the P+ diffusion zone. The diffusions are insulated from one another by a field oxide layer 4 and, beneath each field oxide layer, a zone 5 with higher doping than the P⁻ substrate, this zone 5 being generally called a P⁻iso zone or, again, a "field implantation" zone. The triggering threshold of the transistor T is linked to the avalanche voltage of its collector-base junction. This voltage Vo is linked to the surface doping in this zone of the substrate and, more specifically, by the P-iso zone 5 between the two N+ type zones e and c. In the case of typical, present-day CMOS methods, this voltage Vo is of the order of 20 volts.

Now, the limiter triggering voltage E is of the order of 12 volts and is always lower than 20 volts. The threshold E is therefore lower than that of the device T for protection against electrostatic discharges and, should there be electrostatic discharges, then only the limiter will be on. This protection device 4 described in FIG. 2 therefore has no purpose and the limiter risks being destroyed.

Thus, a protection resistor R'e is interposed in series between the terminal A (Vcc) and the limiter (FIG. 3). Between 12 and 20 volts, this resistor R'e enables the voltage at the terminals of the protection device 4 to reach at least 20 volts, thus enabling it to be triggered and hence enabling the discharge current I'e in the limiter to be limited.

The maximum current allowable in the limiter is referenced Icrit. In practice, the current I'e going through the limiter should be lower than Icrit, i.e.: I'e<Icrit Icrit, Vo, E, Re being known and I'e in FIG. 3 being expressed by:

$$I'e = \frac{Vo - E}{Re + R'e}$$

I'e<Icrit leads to:

$$R'e > \frac{Vo - E}{Icrit} - Re$$

It is furthermore sought to have a maximum gain in current in the limiter for protection against latch-up: it is therefore necessary to choose R'e at a value that is as low as possible. In practice, it is possible to approach the minimum value Rmin given in the above inequality, namely:

$$Rmin = \frac{Vo - E}{Icrit} - Re$$

Preferably, for greater security, the maximum current flowing through the limiter will be chosen rather so that it is Icrit/2, and hence:

$$R'e = \frac{2(Vo - E)}{Icrit} - Re \quad (1)$$

will be chosen.

The current flowing in the limiter in the case of overvoltage V1 (applied between the terminals A and B) is then:

$$I'e = \frac{(V1 - E)}{Re + R'e} \quad (2)$$

In a numerical example, with Icrit=400 mA, Vo=20 volts, Re=20 ohms, V1=18 volts and E=12 volts, from (1) it follows that: R'e=20 Ohms and from (2) it follows that: I'e=150 mA.

The apparent current for the triggering of the latch-up of the CMOS circuit is therefore:

$$I'1 = I1 + I'e = 20 + 150 = 170 \ mA$$

Thus, the gain in current is smaller than it is without protection against electrostatic discharges (there is a change from I'1=300 mA to I'1=170 mA), but its level remains very satisfactory.

Another exemplary embodiment of the limiter (FIG. 4) uses a lateral bipolar transistor T' like the one seen here above for the protection device against electrostatic discharges (FIG. 2), but made by overdoping its base b, i.e. by overdoping the P-iso zone 6 (FIG. 4) between the two N+ zones which form the emitter e' and the collector c'. It has indeed been seen that, in doing so, an adjustment is made in the threshold Vo for the triggering of this standard protection device against electrostatic discharges (by modification of the collector-base avalanche voltage). Thus, it is possible to set the threshold Vo for the triggering of the transistor T' at a value between 10 and 15 volts, for example at 12 volts. In such a device, when it is triggered, the dynamic resistance is almost zero: it therefore absorbs all the current without limit. It therefore becomes impossible to trigger the latch-up: we have a limiter (FIG. 5) with characteristics of E=12 volts and Re=0 ohms.

Thus, by having its threshold lowered, the protection device against electrostatic discharges has also become a protection device against latch-up. However, this device is costlier than in the first embodiment, for it requires an additional masking/implantation level in the fabrication of the CMOS circuit, to overdope the base (the making of the zone 6). By contrast, its efficiency is total, because it radically bars the latch-up and because it provides intrinsic protection against electrostatic discharges.

Other embodiments of limiters with the requisite conditions (E between 10 and 15 volts approximately, Re low) are naturally possible to provide protection against latch-up according to the invention.

What is claimed is:

1. A CMOS circuit protected against latch-up, comprising:
    internal circuitry connected between a first more positive supply terminal and a second more negative supply terminal to draw power therefrom, said internal circuitry having, as known parameters, a current $I_1$ and a voltage $V_1$ for the triggering of the latch-up phenomenon;
    a limiter, connected, in parallel with the internal circuitry, between the first supply terminal and the second supply terminal, this limiter having a triggering threshold below voltage $V_1$ and consuming current of a value far higher than $I_1$ when a voltage of $V_1$ or greater is applied between the first and second supply terminals.

2. A CMOS circuit according to claim 1, wherein the triggering threshold of said limiter is higher than a maximum voltage permitted for the operation of the CMOS internal circuitry.

3. A CMOS circuit according to claim 1, wherein said limiter comprises zener diodes that are operatively connected in series between the first supply terminal and the second supply terminal, the sum of the reverse-breakdown threshold voltages of the diodes being equal to the triggering threshold of said limiter.

4. A CMOS circuit according to claim 1, wherein said limiter comprises two zener diodes in series, each diode having a threshold of the order of 6 volts.

5. A CMOS circuit according to claim 1, further comprising a protection circuit against electrostatic discharges which is connected, in parallel with said limiter, between said first supply terminal and said second supply terminal.

6. A CMOS circuit according to claim 1, further comprising a protection resistor which is placed in series between said first supply terminal and said limiter.

7. A CMOS circuit according to claim 1, further comprising: a protection resistor which is placed in series between said first supply terminal and said limiter; and a lateral bipolar transistor, having a collector connected to said first supply terminal, and an emitter and a base connected to said second supply terminal.

8. A CMOS circuit according to claim 1, wherein said limiter is a lateral bipolar transistor, one collector of which is connected to said first supply terminal, and one emitter and one base of which is connected to said second supply terminal, and wherein said base has been overdoped to diminish a collector-base avalanche voltage.

9. The integrated circuit of claim 1, wherein said limiter has a threshold voltage in the range of about 10–15 V inclusive.

10. The integrated circuit of claim 1, wherein said power supply connections are specified for connection for approximately 5 Volts of supply voltage, and said limiter has a threshold voltage of about 12 V.

11. The integrated circuit of claim 1, wherein said limiter has a dynamic on-resistance of no more than a few tens of ohms.

12. The integrated circuit of claim 1, wherein said limiter comprises multiple Zener diodes in series.

13. A CMOS integrated circuit, comprising:
first and second power supply input connections;
a plurality of active devices connected to implement a desired circuit configuration, and operatively connected to be powered from said first and second power supply input connections, and configured to reliably withstand peak voltages of at least a specified value Vmax;
a limiter circuit, having a nonlinear response with a low dynamic impedance $R_e$ at applied voltages greater than a threshold voltage E; said limiter being connected, in series with a resistance, between said first and second power supply connections;
an electrostatic discharge protection device, connected directly between said first and second power supply connections, said electrostatic discharge protection device having a nonlinear response with a very low impedance at applied voltages greater than a threshold voltage Vo;
wherein said limiter and said electrostatic discharge protection device have respective device parameters such that Vmax<E<Vo.

14. The integrated circuit of claim 13, wherein said limiter has a threshold voltage in the range of about 10–15 V inclusive.

15. The integrated circuit of claim 13, wherein said power supply connections are specified for connection to approximately 5 Volts of supply voltage, and said limiter has a threshold voltage of about 12 V.

16. The integrated circuit of claim 13, wherein said limiter has a dynamic on-resistance of no more than a few tens of ohms.

17. The integrated circuit of claim 13, wherein said limiter has a dynamic on-resistance of about 20 ohms.

18. The integrated circuit of claim 13, wherein said limiter comprises multiple Zener diodes in series.

19. A CMOS integrated circuit, comprising:
first and second power supply input connections;
a plurality of active devices connected to implement a desired circuit configuration, and operatively connected to be powered from said first and second power supply input connections, and configured to reliably withstand peak voltages of at least a specified value Vmax; said plurality of active devices collectively having a latchup trigger voltage of least V1, and a latchup holding current of at least I1;
a limiter circuit, comprising a Zener diode structure having a threshold voltage E; said limiter being connected, in series with a resistance, between said first and second power supply connections;
an electrostatic discharge protection device, comprising a diode-connected bipolar transistor connected directly between said first and second power supply connections, said electrostatic discharge protection device having a threshold voltage Vo;
wherein said limiter and said electrostatic discharge protection device have respective device parameters such that Vmax<E, E<V1, and E<Vo.

20. The integrated circuit of claim 19, wherein said limiter has a threshold voltage in the range of about 10–15 V inclusive.

21. The integrated circuit of claim 19, wherein said power supply connections are specified for connection to approximately 5 Volts of supply voltage, and said limiter has a threshold voltage of about 12 V.

22. The integrated circuit of claim 19, wherein said limiter has a dynamic on-resistance of no more than a few tens of ohms.

23. The integrated circuit of claim 19, wherein said limiter has a dynamic on-resistance of about 20 ohms.

24. The integrated circuit of claim 19, wherein said limiter comprises multiple Zener diodes in series.

* * * * *

UNITED STATES PATENT AND TRADEMARK OFFICE
CERTIFICATE OF CORRECTION

PATENT NO.   : 5,347,185
DATED         : September 13, 1994
INVENTOR(S)  : Francois Tailliet It is certified that error appears in the above-identified patent and that said Letters Patent is hereby corrected as shown below:

<u>Column 6,</u>
Lines 28-42,
Claim 1 should read as follows:

1. A CMOS circuit protected against latch-up, comprising:
internal circuitry connected between a first more positive supply terminal and a second more negative supply terminal to draw power therefrom, said internal circuitry having, as known parameters, a current $I_{sub.1}$ and a voltage $V_{sub.1}$ for the triggering of the latch-up phenomenon;
    a limiter, connected in parallel with the internal circuitry, between the first supply terminal and the second supply terminal, this limiter having a triggering thershold below voltage $V_{sub.1}$ and consuming current of a value far higher than $I_{sub.1}$ when a voltage of $V_{sub.1}$ or greater is applied between the first and second supply terminals.

Signed and Sealed this

Seventh Day of January, 2003

JAMES E. ROGAN
*Director of the United States Patent and Trademark Office*